United States Patent
Li et al.

(10) Patent No.: US 10,095,824 B1
(45) Date of Patent: Oct. 9, 2018

(54) SYSTEMS AND METHODS FOR SYMMETRIC H-TREE CONSTRUCTION WITH COMPLICATED ROUTING BLOCKAGES

(71) Applicant: CADENCE DESIGN SYSTEMS, INC., San Jose, CA (US)

(72) Inventors: Zhuo Li, Austin, TX (US); Wen-Hao Liu, Cedar Park, TX (US); Charles Alpert, Austin, TX (US); Brian Wilson, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 42 days.

(21) Appl. No.: 15/293,010

(22) Filed: Oct. 13, 2016

(51) Int. Cl.
G06F 17/00 (2006.01)
G06F 17/50 (2006.01)

(52) U.S. Cl.
CPC ...... *G06F 17/5072* (2013.01); *G06F 17/5077* (2013.01)

(58) Field of Classification Search
USPC ........................................................ 716/119
See application file for complete search history.

(56) References Cited

U.S. PATENT DOCUMENTS

| | | | |
|---|---|---|---|
| 2007/0016884 A1* | 1/2007 | Nishimaru | G06F 17/5045 716/113 |
| 2009/0020863 A1* | 1/2009 | Choi | G06F 1/10 257/686 |
| 2012/0047478 A1* | 2/2012 | Ge | G06F 17/5031 716/108 |

* cited by examiner

*Primary Examiner* — Mohammed Alam
(74) *Attorney, Agent, or Firm* — Eric L. Sophir; Dentons US LLP

(57) ABSTRACT

Disclosed herein are systems and methods to construct a symmetric clock-distribution H-tree in upper layers of an integrated circuit (IC), which may have complicated routing and/or placement blockages. The systems and methods disclosed herein may implement concomitant bottom-up wiring and top-down rewiring to achieve a clock-distribution tree symmetrically balanced across all of the hierarchical levels while respecting the complicated routing and/or placement blockages. Such symmetrically balanced clock-tree ensures that a clock-signal reaches all of the clock-sinks simultaneously or near simultaneously thereby minimizing clock-skew across the clock-sinks. The minimal skew symmetric clock-distribution H-tree may therefore be used for higher performance and high speed ICs.

20 Claims, 8 Drawing Sheets

SYSTEMS AND METHODS FOR SYMMETRIC H-TREE CONSTRUCTION WITH COMPLICATED ROUTING BLOCKAGES

TECHNICAL FIELD

This application relates generally to the field of optimizing electronic circuit designs, and more specifically systems, methods, and products for constructing a symmetric H-tree for clock-signal distribution in a high performance integrated circuit (IC).

BACKGROUND

A semiconductor (IC) has a large number of circuit devices with complex interconnections. The placement and interconnection of the components of the IC may be facilitated with an Electronic Design Automation (EDA) tool, which allows flexibility in design and optimization of the IC. EDA technologies typically run on an operating system in conjunction with a microprocessor-based computer system or other programmable control system.

One of the challenges for an IC circuit is to construct a clock-distribution tree that carries clock-signal to the synchronous circuit devices in the IC without significant clock-skews or clock-latencies. In other words, the challenge is to construct a clock-distribution tree, wherein all of the unevenly distributed clock sinks in the IC have same or nearly the same wirelength from the clock-signal source. A clock sink may be a synchronous circuit device such as a flip-flop or may be a clock buffer connected to one or more synchronous circuit devices. In addition to the complexity of uneven distribution of the clock-sinks, there may be an additional layer of complexity of various routing and/or placement blockages within the IC that limit the potential locations for construction of a clock-distribution tree.

For example, a clock-tree distribution network may be constructed at higher layers of the IC, where the metal pitch of the interconnecting wires is substantially greater than those of the lower layers. Therefore, the wires at higher layers of the IC require thicker routing channels occupying a larger surface area. The required large surface area may not readily available because of the large number of components placed on the IC. Furthermore, the power grid or the power mesh for the IC may in the same layer as the clock layer. The presence of power grid may create more routing and/or blockages further complicating the construction of a symmetric clock-distribution tree with a minimal amount of clock-skew.

Conventional methods construct a clock-distribution tree by placing an entire clock-tree structure on the IC without the placement and routing blockage considerations. In the conventional methods, a clock-tree is placed centered around the middle portion of the IC. When a clock-signal wire of the tree encounters a routing blockage, the conventional methods simply route the clock-signal wire around the blockage. Each of the clock-signal wires may encounter an unique routing blockage and, therefore, each of the clock-signal wires may have to be routed differently by the conventional methods, such as detouring at the same layer or routing at a lower layer. The conventional methods further do not consider the effect of routing a clock-signal wire to the other clock-signal wires in the clock-distribution tree. The end result of the conventional methods is a non-symmetric, a high-skew, and less efficient clock distribution tree, which cannot be used for high performance and fast ICs.

SUMMARY

Systems and methods are desired that construct a highly symmetric, low-skew, clock-distribution tree for high performance and fast ICs. Systems and methods disclosed herein attempt to address the above issues and may further provide a number of other benefits as well. Systems and methods disclosed herein aim to construct a symmetric H-tree resulting in an improved, high performance, and fast IC.

In one embodiment, a computer-implemented method comprises identifying, by a computer, a first record of a first clock-tree segment at a first location in an integrated circuit (IC) and a second record of a second clock-tree segment at a second location in the IC, wherein the second clock-tree segment is to be wired to the first clock-tree segment; and upon determining by the computer that a routing track is unavailable from the midpoint or near midpoint of the first clock-tree segment to the midpoint or near midpoint of the second clock-tree segment: determining, by the computer, at least one of a first alternate location for the first clock-tree segment and a second alternate location for the second clock-tree segment such that a routing track is available to route a clock-signal wire from the midpoint or near midpoint of the first clock-tree segment to the midpoint or near midpoint of the second clock-tree segment; updating, by the computer, location information in at least one of the first record of the first clock-tree segment, from the first location to the first alternate location and the second record of second clock-tree segment from the second location to the second alternate location; generating, by the computer, a record of a first clock-tree segment hierarchically above the first and second clock-tree segments, wherein the first clock-tree segment hierarchically above the first and second clock-tree segments includes the first clock-tree segment wired to the second clock-tree segment by a first clock-signal wire in the routing track and connecting the midpoints or near midpoints of the first and second clock-tree segments; updating, by the computer, a record of at least one clock-tree segment hierarchically below the first and second clock-tree segments based upon updating the location information in at least one of the first and second records.

In another embodiment, a system for circuit design comprises one or more computers comprising a non-transitory machine-readable media configured to store a plurality of records of a plurality of clock-tree segments forming a at least a portion of a clock-distribution tree in an integrated circuit (IC); and at least one computer of the one or more computers, the at least one computer coupled to the non-transitory machine readable media storing the plurality of records and comprising a processor configured to: identify a first record of a first clock-tree segment at a first location in the IC and a second record of a second clock-tree segment at a second location in the IC and to be wired to the first clock-tree segment; upon determining by the computer that a routing track is unavailable from the midpoint or near midpoint of the first clock-tree segment to the midpoint or near midpoint of the second clock-tree segment: determine at least one of a first alternate location for the first clock-tree segment and a second alternate location for the second clock-tree segment such that a routing track is available to route a clock-signal wire from the midpoint or near midpoint of the first clock-tree segment to the midpoint or near midpoint of the second clock-tree segment; update location information in at least one of the first record of the first clock-tree segment, from the first location to the first alternate location and the second record of second clock-tree segment from the second location to the second alternate location; generate a record of a first clock-tree segment hierarchically above the first and second clock-tree segments, wherein the first clock-tree segment hierarchically above the first and second clock-tree segments includes the first clock-tree segment wired to the second clock-tree segment by a first clock-signal wire in the routing track and connecting the midpoints or near midpoints of the first and second clock-tree segments; update a record of at least one clock-tree segment hierarchically below the first and second clock-tree segments based upon updating the location information in at least one of the first and second records.

BRIEF DESCRIPTION OF THE DRAWINGS

The accompanying drawings constitute a part of this specification and illustrate embodiments of the subject matter disclosed herein.

DETAILED DESCRIPTION

Figure 1:
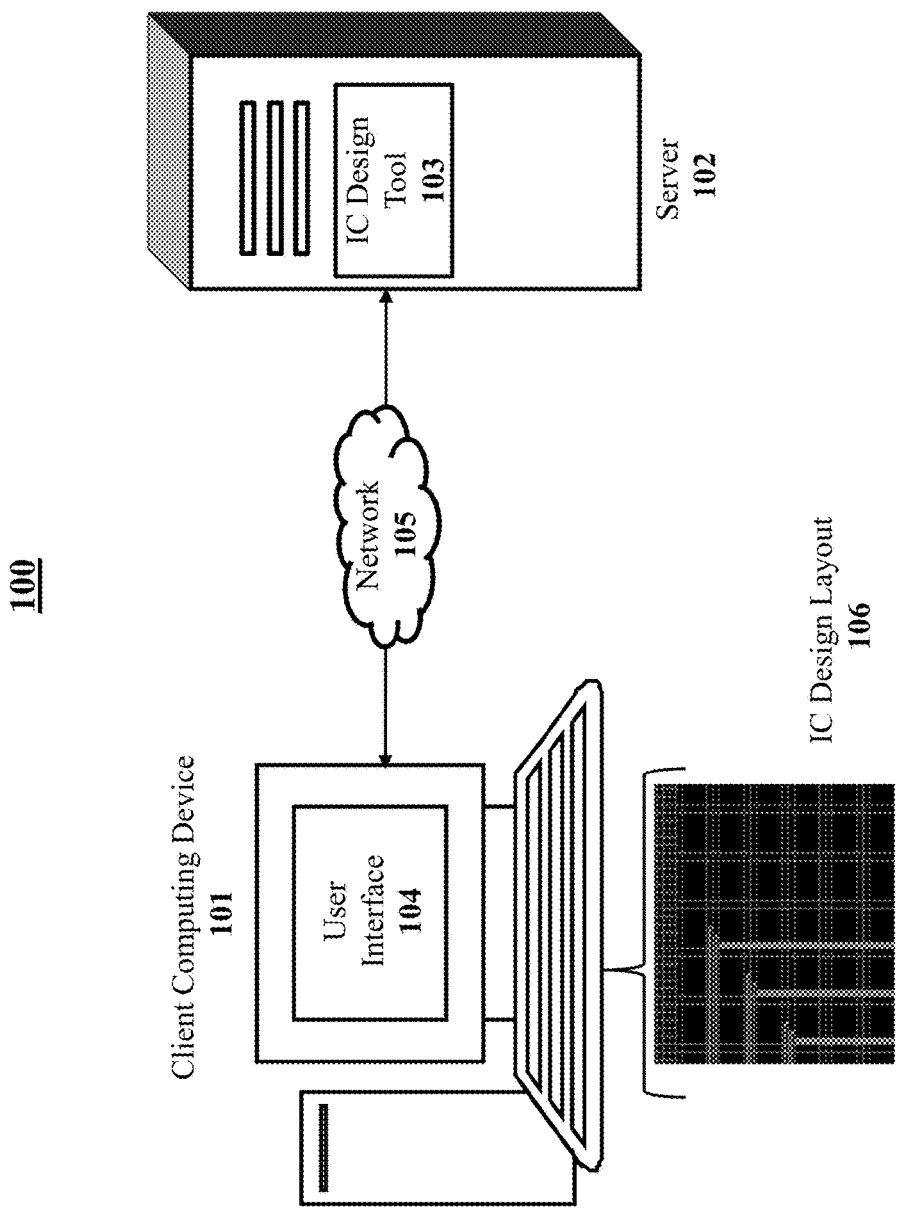
FIG. 1 is a schematic diagram illustrating a system, according to an exemplary embodiment.

Reference will now be made to the illustrative embodiments illustrated in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. The present disclosure is here described in detail with reference to embodiments illustrated in the drawings, which form a part here. Other embodiments may be used and/or other changes may be made without departing from the spirit or scope of the present disclosure. The illustrative embodiments described in the detailed description are not meant to be limiting of the subject matter presented here.

Embodiments disclosed herein include systems and methods for constructing a symmetric clock-tree distribution network in an integrated circuit (IC) having complicated routing blockages. The embodiments of the present disclosure may be implemented in electronic design automated (EDA) technologies, such as a custom IC design system having a graphical user interface or layout editor running program code to assist a circuit designer to generate, implement, and optimize customized electronic circuit design. Although the present disclosure can be implemented to run with custom design systems, it is understood that the present disclosure is not limited thereto and may also be implemented with other known or later developed EDA technologies or hardware description languages capable of generating and manipulating various circuit devices to generate and optimize electronic layout.

The EDA layout software and computing devices may access a design database hosted on one or more computing devices configured store records of the design elements of the IC. The design database may enforce a standard data record format, such as an OpenAccess (OA) database, allowing for interoperability support between disparate electronic design software tools. The EDA layout software and associated database may generate, store, and/or reformat data according to any number of proprietary and/or standardized formats and protocols. The EDA layout software may include tools (e.g., executable routines, associated software programs) configured to synthesize hardware description language, such as VHDL and Verilog, to generate a netlist file representing a netlist of a circuit, or a set of data records representing a netlist of a circuit.

A clock-distribution network or a clock-tree may include a plurality of interconnections carrying a clock-signal from a clock source to the circuit devices synchronized by the clock-signal. A clock-tree may further include one or more clock-buffers, which are circuit devices, which receive, amplify, and relay the clock-signal to other circuit devices downstream. The devices that receive the clock-signals, such as clock-buffers (also known as tapping-points) or other synchronous circuit devices are generally known as clock-sinks. One of the design goals of constructing a clock-tree is to minimize clock-skew between the clock-sinks in an IC.

A clock skew between two clock-sinks is the relative time difference between the arrivals of the clock-signals at the clock-sinks. For example, if a clock-signal arrives five picoseconds earlier to a first clock-sink compared to a second clock-sink, then the clock-skew between the first clock-sink and the second clock-sink is five picoseconds. To accommodate for the clock-skew between different clock-sinks, a clock-signal with a large clock cycle—larger than the largest amount of skew in the IC—may have to be generated. The clock cycle is the reciprocal of the clock frequency, and therefore a clock-signal with a larger clock cycle has a lower frequency than a clock-signal with a smaller clock cycle. In other words, an IC with a larger clock-cycle is slower than an IC with a smaller clock cycle. It is therefore desired that for high-performance and faster IC's, the clock-skew has to be kept minimal. The ideal clock-skew for an IC is zero.

Clock-skew may be minimized by constructing a symmetric clock-distribution network or clock-tree. A symmetric clock-tree may have the same wirelength from a clock-signal source to each clock-sink in the IC such that a clock-signal originating at the source will traverse the same distance (or wirelength) to arrive at each of the sinks simultaneously or near simultaneously. A symmetric H-tree is an example of a symmetric clock-tree. An H-tree may be a hierarchical tree comprising hierarchically arranged segments. A clock-tree segment may include one or more pairs of clock-sinks, or "tapping-points." For example, a level_zero segment or a leaf of the H-tree may include a pair of tapping-points wired to each other. Moving up a level, each level_one segment may include two level_zero segments wired to each other. In other words, a level_one segment may include a first pair of tapping-points wired to each other by a first interconnecting wire, a second pair of tapping-points wired to each other by a second interconnecting wire, and the first interconnecting wired with the second interconnecting wire by a third interconnecting wire. Similarly, a level_two segment may include two level_one segments. In other words, a level_two segment may include four pairs of tapping-points, four wires to interconnect each pair of tapping-points to construct two pairs of level_zero segments, two wires to interconnect each pair of level_zero segments to construct two level_one segments, and a wire to interconnect the two level_one segments to construct the level_two segment. Therefore the number of tapping-points for each successive higher level increases by a factor of two. In other words, a level_zero segment includes two tapping-points, a level_one segment includes four tapping-points, a level_two segment includes eight tapping-points, a level_three segment includes sixteen tapping-points, and so on and so forth.

One of the approaches to construct a symmetric H-tree tree may be to consider all of the combinations of all the potential placement locations of the tapping-points. For example, if there are N tapping-points, with each-tapping-point having n potential placement locations, an un-optimized approach may consider each of the N*n combinations, which may be computationally prohibitive for a large number of tapping-points and/or a large number of potential locations. Embodiments disclosed herein may reduce the computation time by eliminating a significant number of the combinations from the total of N*n combinations. For example, the embodiments disclosed herein start by placing, pairing, and wiring the tapping-points at the shortest distance possible. The distances between the tapping-points may be increased if the future iterations warrant such increments to maintain the symmetry of the clock-distribution tree. In other words, the embodiments disclosed herein may construct a symmetrical clock-distribution tree with the lowest wirelength possible, by starting with combinations that keep the tapping-points and the clock-tree segments closer together. A symmetrical tree, therefore, may be constructed by only considering the "lower" combinations—wherein the tapping-points and/or the tree segments are placed closer together. Accordingly, the "higher" combinations may not have to be considered at all, thereby improving the runtime of clock-router.

Embodiments disclosed herein describe the systems and methods to recursively construct a symmetric H-tree using a combination of bottom-up and top-down processes. Implementing the bottom-up process, an IC design tool may recursively complete a construction of the current level of the H-tree before moving on to a higher level. However, the IC design tool may also implement a top-down process to ensure that levels below the current level do not break their symmetry and do not violate the placement and routing constraints. For example, if the current level is level_two, the IC design tool may recursively construct symmetric level_two segments. However, for every level_two segment constructed, the IC design tool may implement the top-down process, to determine if the symmetry and/or the placement and routing constraints of the lower levels have been broken. If such determination is made, the IC design tool may recursively relocate and/or rewire the lower level segments to maintain the symmetry and meet the placement and routing constraints. For instance, at level_zero if the wirelength of the interconnection between the tapping-points was 10 units (e.g. 10 nm) to construct a symmetric H-tree at level_zero, and the symmetry was not maintained at level_two for the 10 units level_zero interconnections, the IC design tool may construct a symmetric level_zero using 11 units long wires. If the 11 units long wires broke the symmetry at level_one, the IC design tool can go top down again and construct a symmetric level_zero using 12 units long wires. If the 12 units long wires maintained the symmetry at level_one as well, the IC design tool may go bottom-up to construct a symmetric level_two.

Although the embodiments herein describe a construction of a symmetric H-tree, one ordinarily skilled in the art also should understand that the embodiments also encompass optimizing an asymmetric or unbalanced H-tree make the H-tree more symmetric. For example, a global router may have constructed a rough H-tree that may not be symmetric, and the embodiments disclosed herein may use a combination of the bottom-up and top-down approach to relocate the tapping-points and/or rewire the interconnections to make the rough H-tree more symmetric. Furthermore, one ordinarily skilled in the art should appreciate that the embodiments described herein are not confined to constructing a symmetric H-tree, and may be used to construct other types of symmetric clock-distribution trees. Furthermore, one ordinarily skilled in the art appreciates that the embodiments may be used to construct multiple independent clock-distribution trees different portion of the IC.

After the IC design tool constructs a clock-distribution tree, the IC design tool may select a sub-tree within the clock-distribution tree. The IC design tool may select the sub-tree based on an user input and/or parameters such as the dimension of the clock-distribution tree and the orientation of the clock-distribution tree within the IC. For example, for a symmetric H-tree, the IC design tool may select a upper left quarter of the H-tree as the sub-tree. The IC design tool may then move the sub-tree to new location. For example, the IC design tool may move the sub-tree ten routing tracks north and ten routing tracks east. The IC design tool may determine the dimensions of the movement of the sub-tree based on the size and structure of the sub-tree and the availability of routing tracks in the IC. In some embodiments, the IC design tool may move the sub-tree such that the sub-tree maintains a connection with its parent clock-distribution tree. In other embodiments, the IC design tool may move the sub-tree such that the sub-tree is disconnected from its parent clock-distribution tree. In this case, the sub-tree may form an independent clock-distribution tree at the new location.

FIG. 1 illustrates an electronic design automation system 100, according to an exemplary embodiment. The electronic design automation system 100 may include any number of computing devices; the exemplary embodiment may include a client 101 and a server 102. The client 101 may be connected to the server 102 via hardware and software components of one or more networks 105. A network 105 may also connect various computing devices with databases or other components of the system 100. Examples of the network 105 include, but are not limited to, Local Area Network (LAN), Wireless Local Area Network (WLAN), Metropolitan Area Network (MAN), Wide Area Network (WAN), and the Internet. The communication over the network 105 may be performed in accordance with various communication protocols, such as Transmission Control Protocol and Internet Protocol (TCP/IP), User Datagram Protocol (UDP), and IEEE communication protocols.

A client device 101 may be any computing device comprising a processor/microcontroller and/or any other electronic component that performs one or more operations according to one or more programming instructions. The examples of the computing device may include, but are not limited to, a desktop computer, a laptop, a personal digital assistant (PDA), a smartphone, a tablet computer, and the like. The client computing device 101 may be configured to communicate with one or more servers 102 of the system 100 through one or more networks 105, using wired and/or wireless communication capabilities. A user interface 104 may include a Graphical User Interface (GUI) that renders an interactive, graphical representation of an IC design, layout, schematic, or other logical representation 106, the IC that is being designed and optimized using a design tool 103. The GUI 104 may provide interactive elements, such as graphical representations of IC design elements (e.g., flops, clock-gaters), for a user to manipulate the IC design layout 106. In some embodiments, the user interface 104 may include a text based interface allowing the user to enter manual commands for designing and optimizing the IC.

A server 102 may be accessible to a client 101 via one or more networks 105. The server 102 may be any computing device comprising a processor and other computing hardware configured to execute an IC design tool 103 software module (e.g., EDA design software) that may analyze and optimize an IC design. In operation, using a client device 101 to access a design tool 103 hosted on a server 102 over a network 105, a circuit designer may interact with the IC design tool 103, through a number of input devices of the client device 101, such as by inputting a selection as with a mouse or inputting a request as with a keyboard. The IC design tool 103 may generate any number of graphical interface 104 responses based on the inputs received from the client device 101, and then send the data back to the client device 101 to be rendered on the GUI 104.

The server 102 may execute one or more component software modules of the IC design tool 103 software program, which may be a software program that allows users (e.g., engineers, circuit designers) to design and optimize circuit designs through software modules. The IC design tool 103 may provide users with interactive design interfaces 104 for designing an IC and the various design elements, execute automated optimization processes, and execute automated layout-generation processes. The server 102 may comprise, or may be in networked-communication with, non-transitory machine-readable media configured to store a netlist of or any other file including records of IC design elements, which may be a machine-readable computer file or a design database containing one or more records of design elements (e.g., circuit devices) of the IC design. In operation, the IC design tool 103 may analyze and optimize the design elements of the netlist or any other type of file associated with the IC design. Non-limiting examples of circuit devices may include memory devices (e.g., flops), combination logic gates (e.g., AND, OR, NOT, NOR, NAND, XOR), and multiplexers, among others. The netlist or any other type of file may also include records of a plurality of nets. The nets may be the records associated with the wires interconnect the plurality of circuit devices. The netlist or any other type of file may also store a plurality of records associated with the routing tracks in the IC. The plurality of records associated with the routing tracks may indicate whether at least portions of routing tracks are blocked or are available for placing one or more nets. The netlist (e.g., netlist file, design database records) or any other type of file may store the positions of the circuit devices in a fabrication die of the IC, and the positions of tapping-points in the die of the IC. In some embodiments, the positions may be expressed in terms of X, Y coordinates with respect to a Cartesian abscissa and ordinate defined in the die. In other embodiments, the positions may be expressed in terms of polar coordinates. It should be understood that these coordinate systems are non-limiting upon how the system, software modules, and data storage elements may express the position of design elements on the die of the IC, as a designer or distinct software module may define or enforce a position referencing system for defining and referring the particular position of design elements in the die of the IC.

The exemplary system 100 is shown in FIG. 1 as comprising only one server 102 for ease of explanation. However, it should be appreciated that the system 100 may comprise a number of servers 102. In some embodiments, the system 100 may comprise multiple interconnected, networked servers 102, some of which may execute various software modules configured to manage and control the resources and performance of the system 100. In some embodiments, the servers 102 may have parallel architectures configured to support multi-threading on multi-core workstations to handle large designs. In such embodiments, the servers 102 may be configured for distributed processing. The server 102 may be logically and physically organized within the same or different devices or structures, and may be distributed across any number of physical structures and locations (e.g., cabinets, rooms, buildings, cities).

Figure 2:
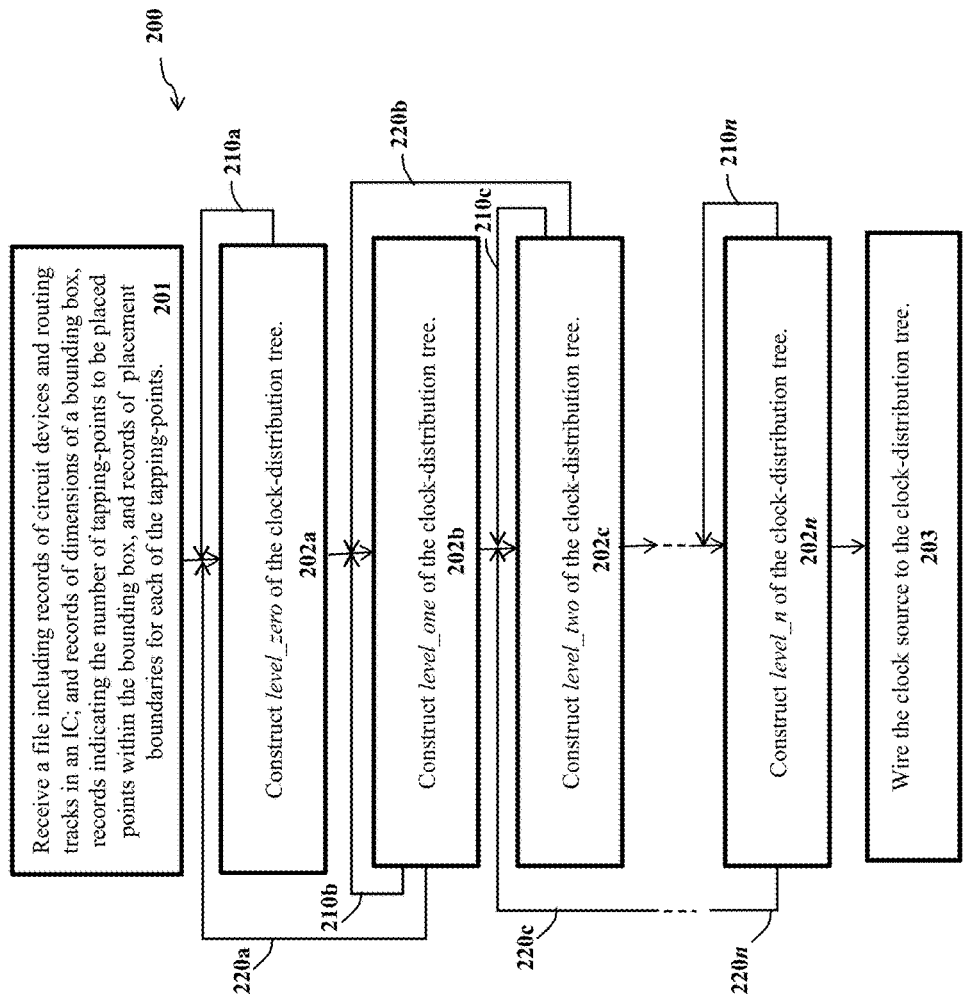
FIG. 2 is a schematic diagram illustrating a method, according an exemplary embodiment.

FIG. 2 shows execution steps of an exemplary method 200 of constructing a symmetric clock-distribution tree, according to an exemplary embodiment. The exemplary method 200 may comprise steps 201, 202*a-n*, and 203, though one having ordinary skill in the art would appreciate that additional and/or alternative steps may be included in various embodiments and that some embodiments may omit one or more steps of the exemplary embodiments may omit one or more steps of the exemplary method 200 described below.

In a first step 201, an IC design tool may receive a file containing records of circuit devices and routing tracks located on one or more layers of an IC. The IC design tool may further receive records of dimensions of a bounding box enclosing a portion of the IC, records indicating number of tapping-points to be placed within the bounding box, and records of placement boundaries for each of the tapping-points. A record of a placement boundary for a tapping-point may indicate a set of potential locations in the IC wherein the tapping-point may be placed. In some implementations, the IC design tool may parse the records in a clock-tree specification file to determine the dimensions of the bounding box, the number of tapping-points to be placed within the bounding box, and the respective placement boundary for each tapping-point. In other implementations, the IC design tool may receive the dimensions of the bounding box from a designer/user through a GUI generated by the IC design tool. In some implementations, a designer/user may specify only the number of tapping-points within the bounding box, and the IC design tool may determine the placement boundaries for each of the tapping-points based upon parameters such as congestion and packing of circuit devices.

The file containing the records of circuit devise and routing tracks in the IC may be in an appropriate format compatible with the input requirements of the IC design tool. Each respective record may include the location field of a circuit device or a routing track. In some implementations, the locations may be expressed in terms of X, Y coordinates with respect to a Cartesian abscissa and ordinate defined in the die. In other implementations, the locations may be expressed in terms of polar coordinates. It should be understood that these coordinate systems are non-limiting upon how the system, software modules, and data storage elements may express the location of design elements on the die of the IC, as a designer or distinct software module may define or enforce a location referencing system for defining and referring the particular location of design elements in the die of the IC. In some implementations, the file may be a netlist file.

In a next step 202a, the IC design tool may construct level_zero of the clock-distribution tree. Level_zero may be lowest level in the clock-distribution tree and may include the leaf segments of the clock-distribution tree. A leaf segment or a level_zero clock-tree segment (or simply a level_zero segment) may contain a pair of tapping-points and a level_zero clock-signal wire interconnecting the pair of tapping-points. To construct a first level_zero clock-tree segment, the IC design tool may query the data records to identify a first pair of tapping-points including a first tapping-point and a second tapping-point. In some instances, the IC design tool may select the first pair of tapping-points based on the proximity, for example, based upon the respective placement boundaries, the IC design tool may determine that the first tapping-point may be placed closer to the second tapping-point than a third-tapping-point. In addition or in the alternative, the IC design tool may select the first pair of tapping-points based upon an availability of a routing track to route a level_zero clock-signal wire from the first tapping-point to the second tapping-point. In some implementations, the IC design tool may randomly select the first pair of tapping-points.

After selecting the first pair of tapping-points, the IC design tool may select a first position within a first placement boundary of the first tapping-point and a second position within a second placement boundary of the second tapping-point. The IC design tool may select the first position and the second position such that there is a minimum possible distance between the first tapping-point and the second tapping-point. The IC design tool may select a minimum distance during the initial iterations and, if required for maintaining the symmetry of the clock-tree, may increase the distance between the first tapping-point and the second tapping-point in subsequent iterations. The IC design tool may then wire the first tapping-point and the second tapping-point using a first level_zero clock-signal wire to construct and generate a record of a first level_zero clock-tree segment.

After constructing the first level_zero segment, the IC design tool may construct other level_zero segments, such as a second level_zero segment. The IC design tool may select a second pair of tapping-points including a third tapping-point and a fourth tapping-point. The IC design tool may also retrieve the record of the first level_zero segment and determine the wirelength of the first level_zero clock-signal wire. To generate a record of the second level_zero segment, the IC design tool may wire the third tapping-point and the fourth tapping-point with a second level_zero clock-signal wire with a wirelength at least as long as the wirelength of the first level_zero clock-signal wire. If the IC design tool determines that the wirelength required by the second level_zero clock-signal wire is equal to or nearly equal to the wirelength of the first level_zero clock-signal wire, the IC design tool may then construct other level_zero segments, such as a third level_zero segment. However, if the IC design tool determines that the wirelength required by the second level_zero clock-signal wire is greater than the wirelength of the first level_zero clock-signal wire, the IC design tool may follow a flow 210a to relocate at least one of the first tapping-point and the second tapping-point and to rewire and reconstruct the first level_zero segment. To maintain the symmetry of the clock-distribution tree, the IC design tool may have to reconstruct the first level_zero segment with same or nearly the same dimensions as the second level_zero segment. In the other words, the IC design tool may recursively construct all of the level_zero segments, such that all of the respective level_zero clock-signal wires have the same or nearly the same wirelength before the IC design tool moves onto a next level.

In a next step 202b, the IC design tool may construct level_one of clock-distribution tree. Level_one of the clock-distribution tree may include one or more level_one clock-tree segments. A level_one clock-tree segment (or simply a level_one segment) may include a pair of level_zero segments wired by a level_one clock-signal wire. To construct a first level_one segment, the IC design tool may select a first pair of level_zero segments including a first level_zero segment and a second level_zero segment. Based upon queries of the data records of the first level_zero segment and the second level_zero segment, the IC design tool may determine the midpoints each of the first and second level_zero clock-tree segments. A midpoint of a clock-tree segment may be a location within the clock-tree segment from which each of the tapping points in the clock-tree is equidistant from the location. In other words, each of the tapping-points in a clock-tree segment may have equal or nearly equal wirelength from the midpoint of the clock-tree segment. Although, the term midpoint has been used throughout this disclosure, it should be understood by one ordinarily skilled in the art that the midpoint is not necessarily confined to the exact midpoint of a clock tree segment and should be interpreted to read on approximate midpoints as well.

In the step 202b, if the IC design tool determines that there is a routing track available to interconnect each of the midpoints of the first and second level_zero clock-tree segments, the IC design tool may generate a data record of a first level_one segment, which includes the first level_zero segment wired with the second level_zero segment by a first level_one clock-tree wire. However, if the IC design tool determines that there is no routing track available to interconnect each of the midpoints, the IC design tool may relocate at least one of the first level_zero segment and the second level_zero segment, such that there is a routing track available to route a clock-signal wire to interconnect the midpoints of the first level_zero segment and the second level_zero segment. For relocating at least one of the level_zero segments, the IC design tool may have to determine that the relocating process does not violate routing and placement constraints and/or the symmetry at lower levels of the clock-distribution tree. For example, the IC design tool may determine that relocating the first level_zero segment violates the placement and routing constraints but relocating the second level_zero segment does not violate the placement and routing constraints and/or symmetry. In such situation, the IC design tool may relocate the second level_zero segment. In some instances, the IC design tool may determine that relocating either of the first level_zero segment and the second level_zero segment may violate the routing constraints, placement constraints, and/or the symmetry of the clock-distribution tree. In such situation, the IC design tool may implement a top-down approach and go back to step 202a and determine new locations for one or more tapping-points contained in the first level_zero segment and/or the second level_zero segment as indicated by the flow 220a. In other words, the IC design tool may recursively rewire the level_zero and level_one segments to maintain the symmetry of the clock-distribution tree and avoid the routing and placement blockages.

For example, the IC design tool may determine that the distance between a first pair of tapping-points in the first level_zero segment is seven units, and further determine that to construct a symmetric first level_one segment, the distance between the first pair of tapping-points in the first level_zero segment should be nine units. The IC design tool then may relocate at least one of the tapping-point in the first pair of the tapping-points in the first level_zero segment such that the wirelength of the clock-signal wire between the first pair of tapping-points is nine units. To maintain the symmetry for all of the level_zero segments, the IC design tool may have to reiterate through all the level_zero segments to relocate and rewire each of the level_zero segments such that the distance between the each pair of tapping-points in each level_zero segment is nine units. If the IC design tool determines that a level_zero segment cannot be constructed from a clock-signal wire of nine units in length, the IC design tool may have to find an alternate wirelength and rewire all pairs of level_zero segments before moving back to step 202b.

After the IC design tool has constructed first level_one clock-tree segment, the IC design tool may construct a second level_one clock-tree segment by wiring a third level_zero clock-tree segment and a fourth level_zero clock-tree segment. If the IC design tool determines that if at least one of the third level_zero segment and the fourth level_zero segment has to be relocated and/or rewired, the IC design tool may follow the flow 220a and go back to step 202a. If the IC design tool determines that neither of the third level_zero segment and the fourth level_zero segment have to be moved, the IC design tool may determine the wirelength of a second level_one clock-signal wire interconnecting the midpoints of the third level_zero segment and the fourth level_zero segment. If the IC design tool determines that the wirelength of the second level_one clock-signal wire is more than that of the first level_one clock-signal wire, the IC design tool may follow the flow 210b to rewire the first level_one clock-tree segment. Furthermore, the IC design tool may determine that rewiring the first level_one clock-tree segment warrants rewiring of the first pair of level_zero clock-tree segments. Based upon such determination, the IC design tool may follow the flow 220a to reconstruct the first pair of level_zero segments, and if required, one or more of the level_zero segments.

In a next step 202c, the IC design tool may construct level_two of the clock-distribution tree. Level_two of the clock-distribution tree may contain one or more level_two clock-tree segments (or simply level_two segments). A level_two segment may include a pair of level_one segments. For example, the IC design tool may construct a first level_two segment interconnecting the midpoints of a first pair of level_one segments by first level_two clock-signal wire. If the IC design tool determines that constructing the first level_two segment violates the routing and placement constrains and/or symmetry of the lower levels, the IC design tool may follow the flow 220b to rewire the level_one segments. The IC design tool may determine that rewiring level_one segments may not be sufficient to rectify the symmetry and/or routing and placement violations, and may follow the flow 220a to rewire the level_zero clock-tree segments. During the rewiring of the level_one clock-tree segments, the IC design tool may also have to follow the flow 210b to ensure that the rewiring each of level_one clock-segments does not violate the symmetry and/or routing and placement constraints. Similarly, during the rewiring of the level_zero clock segments, the IC design tool may have to follow the flow 210a to ensure that rewiring each of the level_zero clock-tree segments does not violate the symmetry and/or routing and placement constraints.

In a next step 200n, the IC design tool may construct level_n of the clock-distribution tree. Although the intermediate steps between 202c and 202n and the associated flows have not been shown and described, one ordinarily skilled in the art should appreciate that there may be one or more intermediate recursive steps to construct the hierarchical level of the clock-distribution tree. Level_n of the clock-distribution tree may contain a level_n clock tree segment. The level_n clock-tree segment (or simply a level_n clock-tree segment) may include a pair of level_n-1 clock-tree segments. To construct the level_n clock-tree segment, the IC design tool may select the records of a first level_n-1 clock-tree segment and a second level_n-1 clock-tree segment. Based upon the records, the IC design tool may determine the midpoints of each of the first and second level_n-1 clock-tree segments. If the IC design tool determines that there is a routing track available from the midpoint of the first level_n-1 clock-tree segment to the midpoint of the second level_n-1 clock-tree segment, the IC design tool may interconnect the midpoint of the first level_n-1 clock-tree segment and the midpoint of the second level_n-1 clock-tree segment through a level_n clock-signal wire. If the IC design tool determines that that there is no routing track available from the midpoint of the first level_n-1 clock-tree segment to the midpoint of the second level_n-1 clock-tree segment, the IC design tool may relocate at least one of the first and second level_n-1 clock-tree segments. However, the IC design tool may determine that relocating at least one of the first and second level_n-1 clock tree segment warrants reconstructing the lower level segments and the IC design tool may follow the flow 220n to retrieve the records of and reconstruct the lower level segments. The IC design tool may further determine whether there is a routing track form a clock-source to the midpoint of the level_n segment. If the IC design tool determines that there is no routing track from the clock-source to the middle of the level_n segment, the IC design tool may follow the flow 210n to reconstruct the level_n segment. The IC design tool may determine that reconstructing the level_n segment warrants reconstructing the lower level clock-tree segments and follow the follow 220n. If the IC tool determines that there is routing a track from the clock-source to the midpoint of the level_n segment, the IC design tool may move on to a next step.

In a next step 203, the IC design tool may wire the clock-source to the clock-distribution tree. More specifically, the IC design tool may use a clock-signal wire from the clock-source to the midpoint of the level_n clock tree segment. The IC design tool may then update the data record of the clock source and the level_n clock-tree segment to indicate that the clock-source and the level_n clock-tree segment have been wired to each other. Therefore, after the completion of the step 203, the IC design tool has constructed a symmetric clock-distribution tree for a high performance and a fast IC. Furthermore, the IC design tool may construct multiple independent clock-distribution trees using the exemplary method. The IC design tool may construct the multiple independent clock distribution trees at different portion of the IC.

After the IC design tool constructs a clock-distribution tree, the IC design tool may select a sub-tree within the clock-distribution tree. The IC design tool may select the sub-tree based on an user input and/or parameters such as the dimension of the clock-distribution tree and the orientation of the clock-distribution tree within the IC. For example, for a symmetric H-tree, the IC design tool may select a upper left quarter of the H-tree as the sub-tree. The IC design tool may then move the sub-tree to new location. For example, the IC design tool may move the sub-tree ten tracks north and ten tracks east. The IC design tool may determine the dimensions of the movement of the sub-tree based on the size and structure of the sub-tree and the availability of routing tracks in the IC. In some embodiments, the IC design tool may move the sub-tree such that the sub-tree maintains a connection with its parent clock-distribution tree. In other embodiments, the IC design tool may move the sub-tree such that the sub-tree is disconnected from its parent clock-distribution tree. In this case, the sub-tree may form an independent clock-distribution tree at the new location.

Figure 3A:
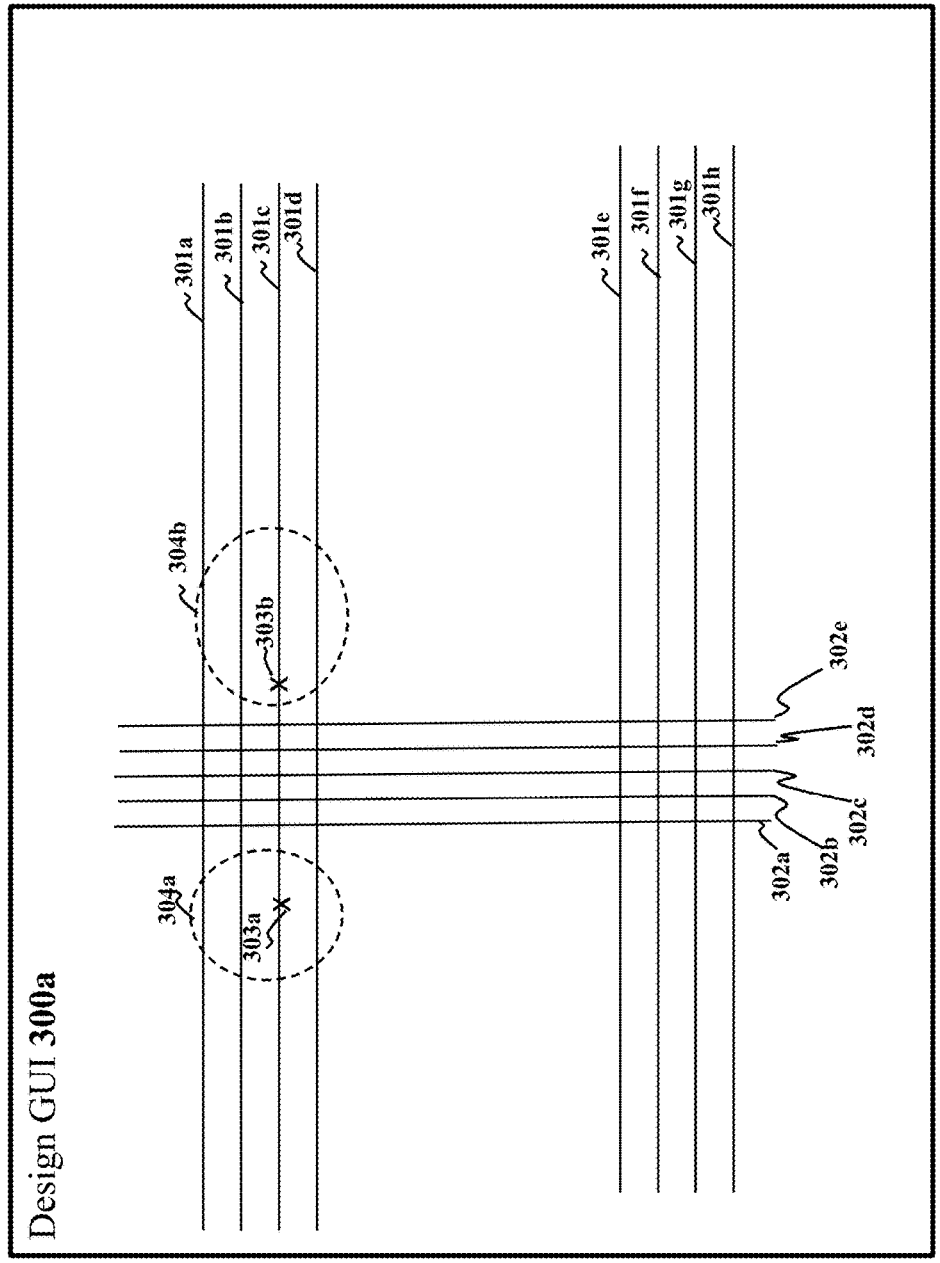
FIG. 3A is a schematic diagram showing a graphical user interface (GUI) rendering a plurality of routing tracks, a plurality of tapping-points, and respective placement boundaries for the plurality of tapping-points.

FIG. 3A shows an exemplary design Graphical User Interface (GUI) 300a generated by an IC design tool during an implementation of an exemplary method, where the design GUI 300a is generated based on data records of a plurality of routing tracks, a plurality of tapping-points and the respective boundaries, and one or more dimensions of a bounding box. The aforementioned data records may be included in a machine-readable computing file or in a design database. The design GUI 300a shows an IC design including a plurality of horizontal routing tracks 301 and vertical routing tracks 302. It should, however, be understood by one ordinarily skilled in the art that the vertical-horizontal nomenclature has been used throughout this description just for the sake of simplicity, and any kind of rectilinear nomenclature can be used to define and describe the relative positioning of the routing tracks. Furthermore, the design GUI 300a does not show other circuit devices such as cells and other interconnections for the sake of simplicity.

The exemplary GUI 300a further shows a first tapping-point 303a and a second tapping-point 303b, which are to be wired to one another. The IC design tool, based upon the data records, may determine a placement boundary 304 for placing of each of the first tapping-point 303a and the second tapping-point 303b. In the example shown by the design GUI 300a, the IC design tool has may have determined a first placement boundary 304a for the first tapping-point 303a and a second placement boundary 304b for the second tapping-point 303b. The IC design tool may determine the placement boundaries 304 based upon a plurality of factors, for example, the position of circuit devices that each respective tapping-point 303 may have to drive, the position of routing tracks available to route the clock-signal to the tapping-points 303, and the level of congestion in the areas proximate to the tapping-points 303. In some implementations, the placement boundaries 304 may have been set by a user/designer.

To route the clock-signal between the first tapping-point 303a and the second tapping-point 303b, the IC design tool may initially select the shortest distance between the first tapping-point 303a and the second tapping-point 303b. A shorter distance may ensure that there is a less clock skew from the clock-signal source to each of the tapping-points 303a, 303b. A short signal wire may also consume less dynamic power during the operation of the IC. Furthermore, starting from the shortest distance may ensure that the IC design tool may consider all possibilities of constructing a nimble and power-efficient clock-distribution tree. On the other hand, if the IC design tool starts from a distance greater than the shortest distance, the design tool may not consider the shortest distance at all and therefore lose out from constructing the shortest and the most-power efficient clock-distribution tree. In other words, starting from the shortest distance possible may allow the IC design tool to expand the distance between the tapping-points in later iterations with the guarantee that the shorter distances have already been considered in the previous iterations.

Figure 3B:
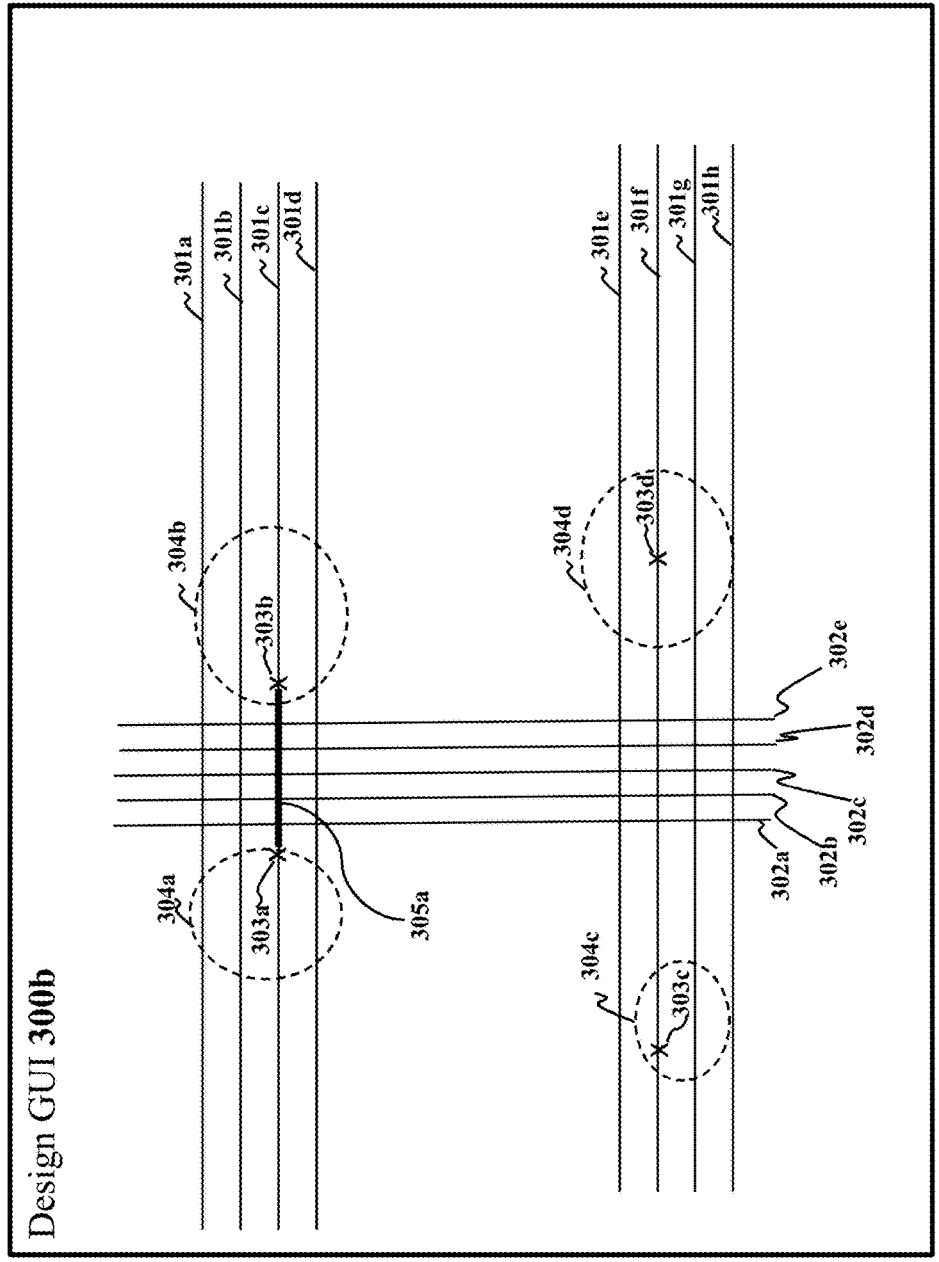
FIG. 3B is a schematic diagram showing an updated GUI rendering a first pair of tapping-points being placed and being wired to each other to construct a first clock-tree segment.

FIG. 3B shows an exemplary design GUI 300b showing an interconnecting wire 305a between the first tapping-point 303a and the second tapping-point 303b. For routing the connection 305a, the IC design tool has placed the tapping-points 303a, 303b within the shortest distance from each other, with the possibility that the distance may increase in the subsequent iterations. The IC design tool may then update the location information in the records of the tapping-points 303a, 303b. The IC design tool may further update the connection information in records of the tapping-points 303a, 303b to indicate that the tapping-points 303a, 303b have been connected to each other through the clock-signal wire wire 305a located on the routing track 301c.

After routing the clock-signal wire 305a between the tapping-points 303a, 303b, the IC design tool may determine that there are other tapping-points 303 to be connected to each other in a pairwise fashion such as the tapping-points 303a, 303b. Based upon such determination, the IC design tool may query the database records to determine the placement boundaries 304c, 304d of a second pair of tapping-points 303c, 303d as shown in the design GUI 300b.

Figure 3C:
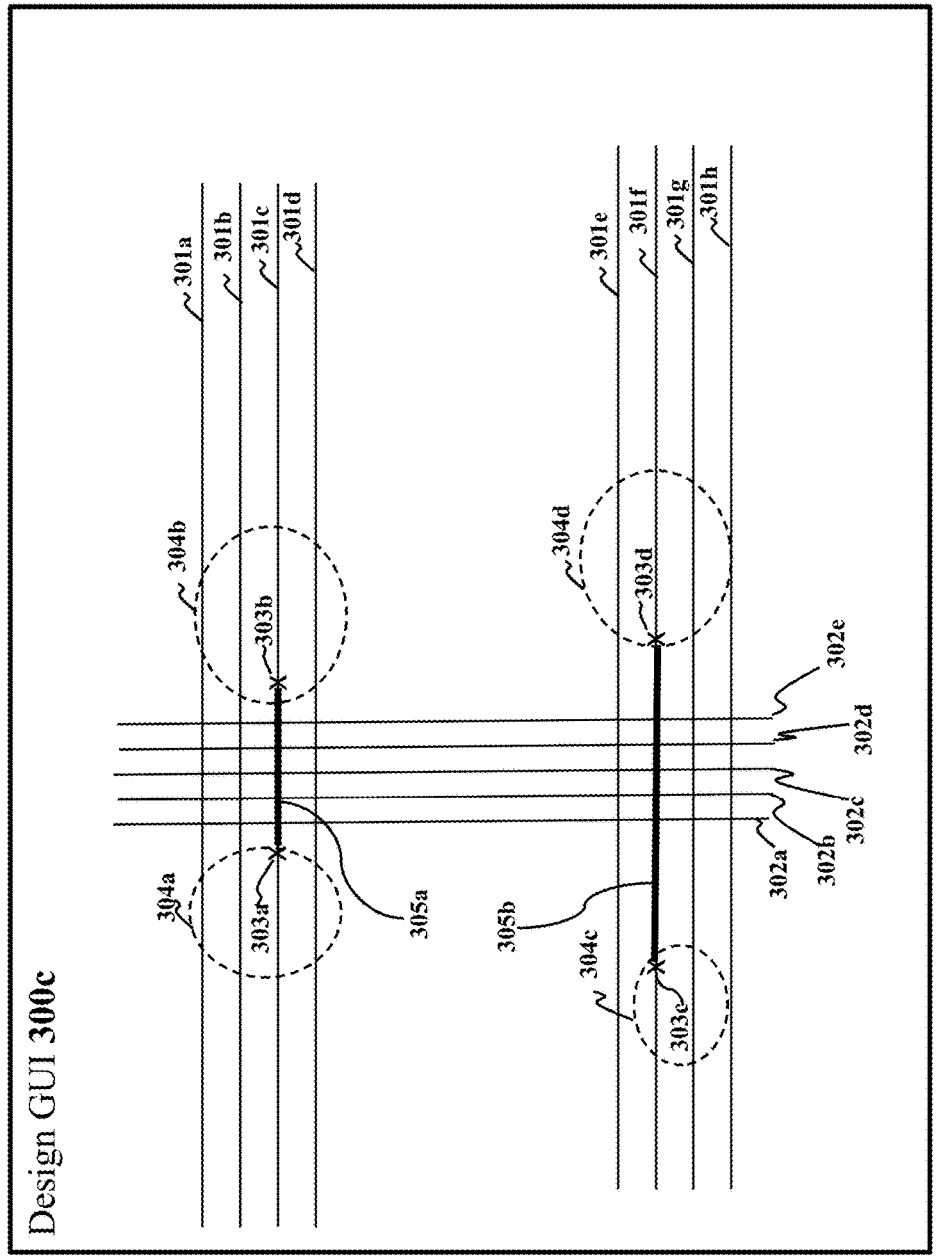
FIG. 3C is a schematic diagram showing an updated GUI rendering a second pair of tapping-points being placed and being wired to each other to construct a second clock-tree segment.

FIG. 3C shows an exemplary design GUI 300c which shows that the IC design tool has routed a clock-signal wire 305b to interconnect the second pair of tapping-points 303c, 303d. As with the first pair of tapping-points 303a, 303b, the IC design tool has selected the shortest distance between the second pair of tapping-points 304c, 304d. In this iteration, the IC design tool may query the data records to determine the wirelength of the clock-signal wire 305a between the previously wired tapping-points 303a, 303b. The IC design tool may then determine that wirelength of the second clock-signal wire 305b exceeds the wirelength of the first clock-signal wire 305a. Based upon this determination, the IC design tool may rewire the previously wired tapping points 303a, 303b such that the wirelength of the first clock-signal wire 305a has the same or nearly the same wirelength as the second clock-signal wire 305b.

Figure 3D:
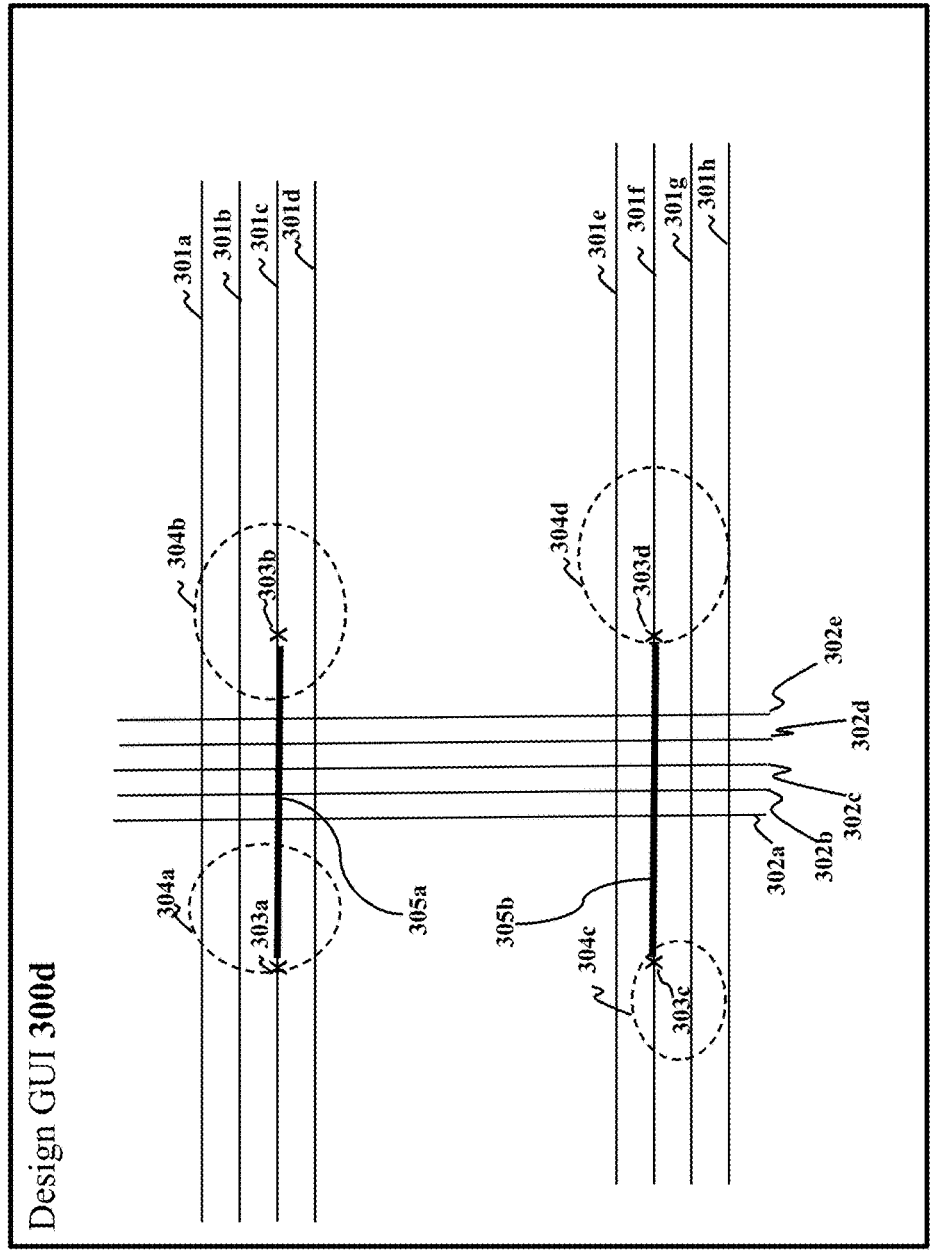
FIG. 3D is a schematic diagram showing an updated GUI rendering a reconstruction of the first clock-tree segment based upon the construction of the second clock-tree segment.

FIG. 3D shows an exemplary GUI 300d generated by the IC design tool during the implementation of the exemplary method. The exemplary GUI 300d may be generated by the IC design tool during the process of rewiring the first pair of tapping-points 303a, 303b based on the determination that the wirelength second clock-signal wire 305b interconnecting the second pair of tapping-points 303c, 303d is greater than the wirelength of the first clock-signal wire 305a interconnecting the first pair of tapping-points 303a, 303b. As seen in the GUI 300d, the IC design tool may determine alternative locations for at least one of the first tapping-point 303a and the second tapping-point 303b within the respective boundaries 304a, 304b. The IC design tool may select these alternative locations based on the wirelength of the second clock-signal wire 305b. In other words, the IC design tool may select the alternative locations for at least one of the first tapping-point 303a and the second tapping-point 303b such that the wirelength of the first clock-signal wire 305a is equal to or nearly equal to a threshold wirelength to maintain the symmetry of the clock-distribution tree, where the threshold wirelength at this iteration is the wirelength of the second clock-signal wire 305b. The IC design tool may then update the data records of the first set tapping-points 303a, 303b, the clock-signal wire 305a, and the routing track 301c based on the new wiring. After the updating, the IC design tool may select the database records of a different pair of tapping-points 303, not shown in the design GUI 300d to wire those selected tapping-points 303 to each other. If, during the wiring of the selected tapping-points, the IC design tool determines that a longer clock-signal wire 305 has to be used compared to the threshold wirelength, the IC design tool may then select the database records of at least one pair of tapping-points 303 that has been already wired to select the alternate locations for the pair of tapping-points 303 such that the length of the clock-signal wire connecting the tapping-points 303 is equal to or nearly equal to the threshold wirelength. The IC design tool may repeat this iterative process recursively until all of the pair of the tapping-points 303 are wired to each other with the respective clock-signal wire 305. For instance, the design GUI 300d shows two pairs of tapping-points 303, wherein each pair is connected by a respective clock-signal wire 305 having equal or nearly equal wirelength.

After all of the pairs of the tapping-points 303 have been wired by the respective clock-signal wires 305, the IC design tool query the database records to determine a pair of clock-tree segments to be wired to one another. At a hierarchical level immediately above the tapping-points 303, a clock-tree segment may contain a pair of tapping-points 303 wired to each other by a clock-signal wire 305. However, at higher hierarchical levels of the clock-distribution tree, a clock tree segment may include a pair of clock tree segments in the level hierarchically below the clock-tree segment. For example, if the IC design tool designates the level of the tapping-points 303 as level_zero in the clock-distribution tree, a clock-tree segment at the level_three may include a pair of clock-tree segments at level_two of the clock-distribution tree. Therefore, the design GUI 300e shows a pair of level_zero segments, the first segment containing the first pair of tapping-points 303a, 303b and the first clock-signal wire 305a and the second segment containing the second pair of tapping-points 303c, 303d and the second clock-signal wire 305b. Based upon the proximity of the first segment and the second segment and/or other factors, the IC design tool may determine that the first segment and the second segment have to be wired to each other.

Figure 3E:
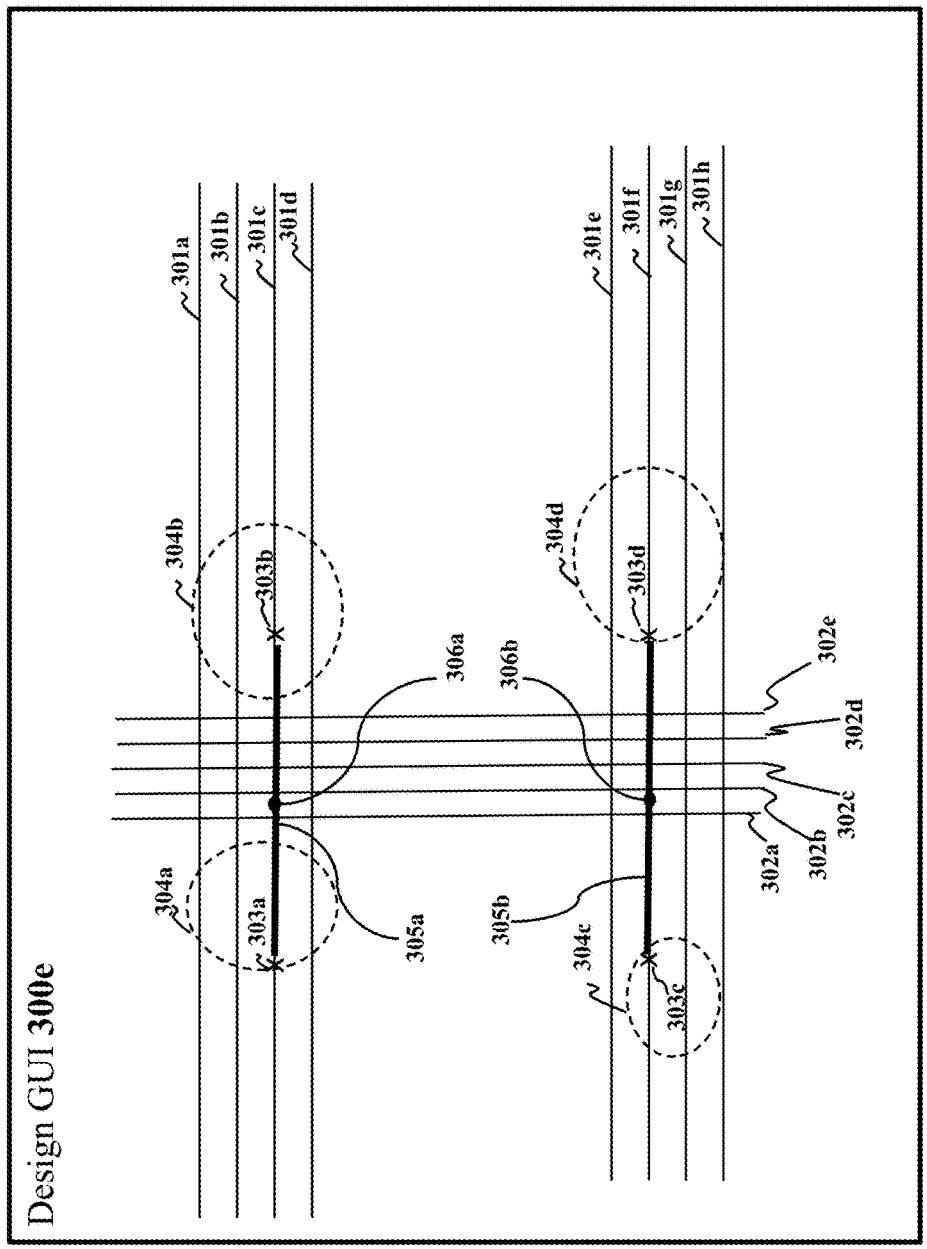
FIG. 3E is a schematic diagram showing an updated GUI rendering a determination of midpoints of each of the first and second clock-tree segments.

FIG. 3E shows an exemplary design GUI 300e generated by the IC design tool during the construction of a clock-tree according to the exemplary method. The design GUI 300e shows that the IC design tool may have determined that the first clock-tree segment, which includes the first pair of tapping-points 303a, 303b and the first clock-signal wire 305a, has to be wired to the second clock-tree segment, which includes the second pair of tapping-points 303c, 303d and the second clock-signal wire 305b, based upon the data records of the points 303a, 303b, 303c, 303d, clock-signal wires 305a, 305b, and the routing tracks 301c, 301f. To maintain the symmetry of the clock-distribution tree, the IC design tool has to create a wiring such that the midpoint 306a or a near-midpoint of the first clock-tree segment is wired to the midpoint 306b or the near midpoint of the second clock-tree segment. After the IC design tool has determined the locations of the respective midpoints 306a, 306b of the clock-tree segments, the IC design tool may query one or more records of the routing tracks 301 proximate to the location the midpoints 306a, 306b. If a routing track 301 is available, the IC design tool may update the records of the clock-signal wires 305 and the available routing track 301 to indicate that the clock-signal wires 305 have been wired to each other.

However, as shown in the exemplary design GUI 300e, there IC design tool may determine that there is available routing track to route a wire between the midpoints 306 or the near midpoints. In such situations, the IC design tool may query the data records of routing tracks 301 proximate to the locations of the midpoints 306. The IC design tool may then determine whether one of the first and second clock-tree segments can be moved such that a wire interconnecting the two clock-tree segments can be routed via one of the routing tracks 301 proximate to the midpoints 306 or near midpoints. The IC design tool may determine that the movement of a clock-tree segment may be within the routing track 301 that the clock-tree segment is located on, or the movement of the clock-tree segment may be in between the routing tracks 301.

As shown in the exemplary design GUI 300e, both of the first and second clock-tree segments have to be moved because the midpoints 306a, 306b for both of clock-tree segments are not located within one of the routing tracks 301. The IC design tool may then have to determine the potential movement not only based upon the availability of routing tracks for the current level of the clock-distribution tree, but also on the availability of the routing tracks for the clock-tree segments at the lower levels and/or the available locations for the tapping-points. For example, the first and second clock-tree segments shown in the exemplary design GUI 300e may belong to level_one of the clock-distribution tree, and tapping-points 303 may belong to level_zero of the clock-distribution tree. Therefore, as shown in the exemplary design GUI 300e, the IC design tool may determine that the first segment, which includes the first pair of tapping-points 303a, 303b, may be moved towards the right along the routing track 301c in the design GUI 300e. However, the IC design tool may determine that the first segment may not be moved towards the left along the routing track 301c in the design GUI 300e because the first tapping-point 303a is restricted from moving towards the left along the routing track 301c as any leftward movement of the first tapping-point 303a will place the first tapping-point 303a beyond the associated boundary 304a.

The IC design tool may determine that the movement of the second clock-tree segment, which includes the second pair of tapping-points 303c, 303d, may even be more The IC design tool may determine that a rightward movement of the second clock-restricted. segment along the routing track 301f in the design GUI 300e will place the third tapping-tree point 303c beyond the associated boundary 304c. The IC design tool may further determine that a leftward movement of the second clock-tree segment along the routing track 301f will place the fourth tapping-point 303d beyond the associated boundary 304d. Based on the aforementioned determinations, the IC design tool may determine that the second clock-tree segment may be moved to horizontal routing track 301g.

Figure 3F:
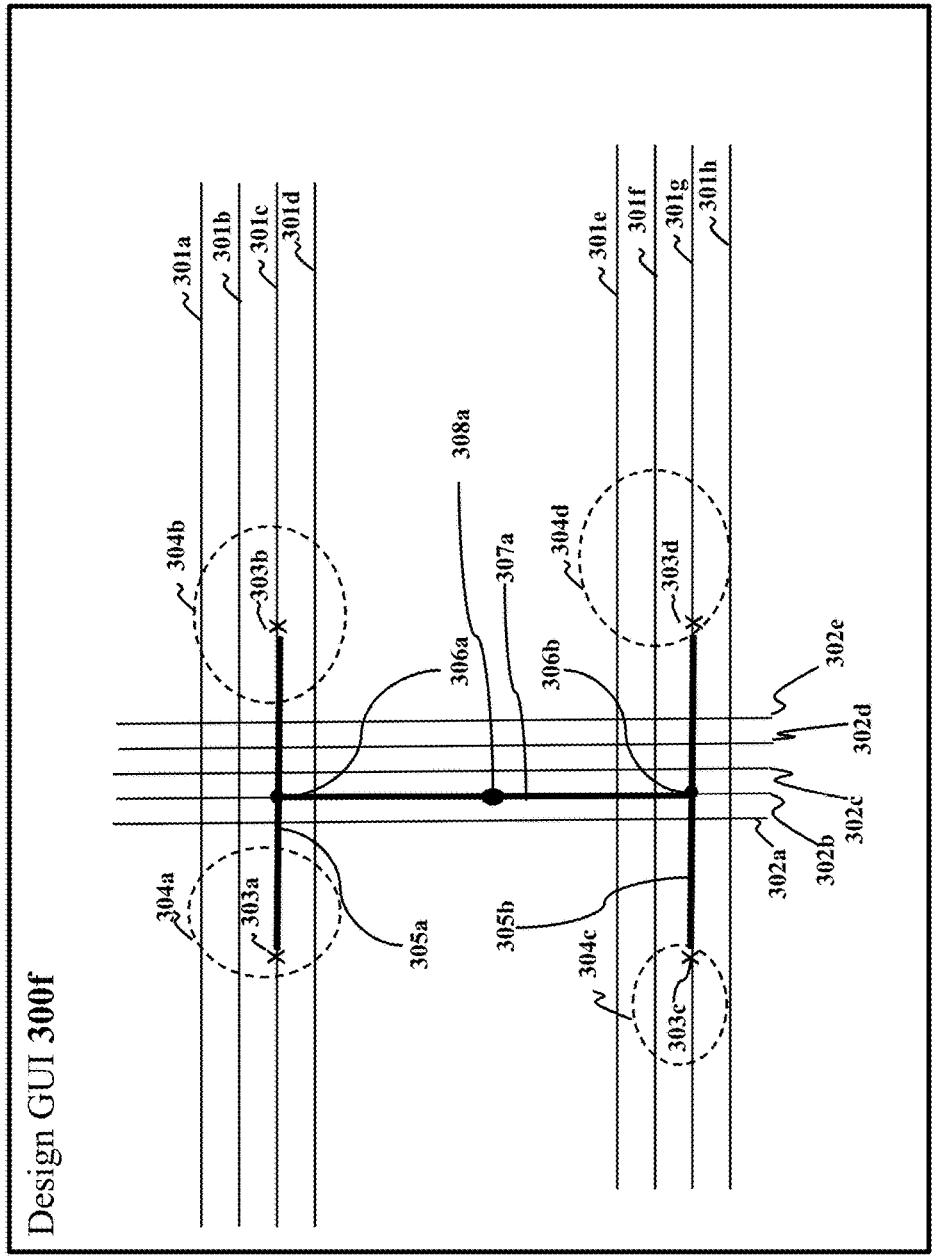
FIG. 3F is a schematic diagram showing an updated GUI rendering a reconstruction of the first and second clock-tree segments and construction of a third clock-tree segment hierarchically above the first and second clock-tree segments.

FIG. 3F shows an exemplary design GUI 300f generated by the IC design tool during the implementation of the exemplary method to construct a symmetric clock-distribution tree. As shown in the design GUI 300f, the IC design tool has moved the first clock-tree segment leftward along the horizontal routing track 301c and may have accordingly updated the records of the tapping-points 303a, 303b, the clock-signal wire 305a, and the routing track 301c. The IC design tool also has moved the second clock tree segment from the routing track 301f to the routing track 301g and may have accordingly updated the data records for the tapping-points 303c, 303d, the clock-signal wire 305b, and the routing tracks 301f, 301g.

The IC design tool may then determine that a vertical routing track 302c is available to for a level_one clock-signal wire interconnecting the midpoint 306a of the first clock tree segment and the midpoint 306b of the second clock-tree segment. The IC design tool may update the database records of the clock-signal wires 305 and the routing track 302c to indicate that the midpoint 306a of the clock-signal wire 305a is wired to the midpoint 306b of the clock-signal wire 305b through the level_one clock-signal wire 307a located at the vertical routing track 302c.

Therefore, the IC design tool may construct a portion of a symmetric clock-distribution tree using the exemplary method. For example, as shown in the exemplary GUI 300f, a clock-signal arriving at the midpoint 308a of the level_one clock-signal wire 307a will reach each of the tapping-points 303 simultaneously or nearly simultaneously. One ordinarily skilled in the art should appreciate that the IC design tool may implement similar processes to construct the remaining process of the clock-distribution tree. Furthermore, the IC design tool may construct multiple independent clock-distribution trees using the exemplary method. The IC design tool may construct the multiple independent clock distribution trees at different portions of the IC.

After the IC design tool constructs a clock-distribution tree, the IC design tool may select a sub-tree within the clock-distribution tree. The IC design tool may select the sub-tree based on an user input and/or parameters such as the dimension of the clock-distribution tree and the orientation of the clock-distribution tree within the IC. For example, for a symmetric H-tree, the IC design tool may select a upper left quarter of the H-tree as the sub-tree. The IC design tool may then move the sub-tree to new location. For example, the IC design tool may move the sub-tree ten tracks north and ten tracks east. The IC design tool may determine the dimensions of the movement of the sub-tree based on the size and structure of the sub-tree and the availability of routing tracks in the IC. In some embodiments, the IC design tool may move the sub-tree such that the sub-tree maintains a connection with its parent clock-distribution tree. In other embodiments, the IC design tool may move the sub-tree such that the sub-tree is disconnected from its parent clock-distribution tree. In this case, the sub-tree may form an independent clock-distribution tree at the new location.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, and the like. When a process corresponds to a function, the process termination may correspond to a return of the function to a calling function or a main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of this disclosure or the claims.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the claimed features or this disclosure. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module, which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A computer-implemented method comprising:
identifying, by a computer, a first record of a first clock-tree segment at a first location in an integrated circuit (IC) and a second record of a second clock-tree segment at a second location in the IC, wherein the second clock-tree segment is to be wired to the first clock-tree segment; and
upon determining, by the computer, that a routing track is unavailable from a midpoint or approximate midpoint of the first clock-tree segment to the midpoint or approximate midpoint of the second clock-tree segment:
determining, by the computer, at least one of a first alternate location for the first clock-tree segment and a second alternate location for the second clock-tree segment such that a routing track is available to route a clock-signal wire from the midpoint or approximate midpoint of the first clock-tree segment to the midpoint or approximate midpoint of the second clock-tree segment;
updating, by the computer, location information in at least one of the first record of the first clock-tree segment, from the first location to the first alternate location and the second record of the second clock-tree segment from the second location to the second alternate location;
generating, by the computer, a record of a first clock-tree segment hierarchically above the first and second clock-tree segments, wherein the first clock-tree segment hierarchically above the first and second clock-tree segments includes the first clock-tree segment wired to the second clock-tree segment by a first clock-signal wire in the routing track and connecting the midpoints or approximate midpoints of the first and second clock-tree segments; and
recursively updating, by the computer, a record of at least one clock-tree segment hierarchically below the first and second clock-tree segments based upon updating the location information in at least one of the first and second records.

2. The method of claim 1, wherein each of the first clock-tree segment, the second clock-tree segment, the first clock-tree segment hierarchically above the first and second clock-tree segments, and the clock-tree segment hierarchically below the first and second clock-tree segments is a part of a symmetric or near symmetric clock-distribution, the method further comprising:
selecting, by the computer, records of one or more clock-tree segments forming a sub-tree within the clock-distribution tree; and
upon determining by the computer that a new location is available for the sub-tree based upon the records of the one or more clock-tree segments and records of one or more routing tracks on the IC:
updating, by the computer, location information in the records of each of the one or more clock-tree segments such that the sub-tree is moved to the new location.

3. The method of claim 1, further comprising:
upon determining by the computer that a routing track is available from the midpoint or approximate midpoint of the first clock-tree segment to the midpoint or approximate midpoint of the second clock-tree segment:
generating, by the computer, a record of a first clock-tree segment hierarchically above the first and second clock-tree segments, wherein the first clock-tree segment hierarchically above the first and second clock-tree segments includes the first clock-tree segment wired to the second clock-tree segment by a clock-signal wire in the routing track and connecting the midpoints or approximate midpoints of the first and second clock tree segments.

4. The method of claim 1, wherein each of the first clock-tree segment, the second clock-tree segment, the first clock-tree segment hierarchically above the first and second clock-tree segments, and the clock-tree segment hierarchically below the first and second clock-tree segments is a part of a symmetric or near symmetric clock-distribution H-tree among a plurality of symmetric or near symmetric independent clock-distribution H-trees, each occupying a different area of the IC and each constructed using the method.

5. The method of claim 4, wherein at least one clock-distribution H-tree among the plurality of symmetric or near symmetric clock-distribution H-trees is located at a higher metal layers in the IC, and wherein one or more clock-signal wires of the at least one clock-distribution H-tree have a relatively high metal pitch.

6. The method of claim 1, further comprising:
identifying, by the computer, respective records of a first tapping-point and a second tapping-point;
determining, by the computer, that a first tapping-point should be wired to the second tapping-point based upon the location information in the respective records of the first and second tapping points; and
generating, by the computer, the first record of the first clock tree segment that includes the first and second tapping points and a clock-signal wire interconnecting the first and second tapping points.

7. The method of claim 1, further comprising
identifying, by the computer, respective records of a third clock-tree segment and a fourth clock-tree segment, wherein the third and fourth clock-tree segments are hierarchically below the first and second clock-tree segments;
determining, by the computer, that the third clock-tree segment should be wired to the fourth clock-tree segment based upon the location information in the respective records of the third and fourth clock-tree segments; and generating, by the computer, the first record of the first clock-tree segment that includes the third and fourth clock-tree segments and a clock-signal wire interconnecting the third and fourth clock-tree segments.

8. The method of claim 1, further comprising:
identifying, by a computer, a third record of a third clock-tree segment at a third location in the IC and a fourth record of a fourth clock-tree segment to be wired to the third clock-tree segment and at a fourth location in the IC, wherein the third and fourth clock-tree segments are hierarchically at same level as the first and second clock-tree segments;
generating, by the computer, a record of a second clock-tree segment hierarchically above the first, second, third, and fourth clock-tree segments, wherein the second clock-tree segment hierarchically above the first, second, third, and fourth clock-tree segment includes the third clock-tree segment wired to the fourth clock-tree segment by a second clock-signal wire interconnecting the midpoint or approximate midpoint of the third and fourth clock-tree segments; and
upon determining by the computer that the wirelength of the second clock-signal wire is greater than the wirelength of the first clock-signal wire:
updating, by the computer, the record of the first clock-tree segment hierarchically above the first and second clock-tree segments to indicate that the wirelength of the first clock-signal wire has been increased to equal or nearly equal the wirelength of the second clock-signal wire.

9. The method of claim 1, wherein the updating the record of at least one clock-tree segment hierarchically below the first and second clock-tree segments includes:
updating, by the computer, the location of the at least one clock-tree segment; and
updating, by the computer, wirelengths of one of more clock-signal wires in the at least one clock-tree segment.

10. The method of claim 1, wherein the routing track spans across at least two layers of the IC.

11. A system for circuit design, the system comprising:
one or more computers comprising a non-transitory machine-readable media configured to store a plurality of records of a plurality of clock-tree segments forming a at least a portion of a clock-distribution tree in an integrated circuit (IC); and
at least one computer of the one or more computers, the at least one computer coupled to the non-transitory machine readable media storing the plurality of records and comprising a processor configured to:
identify a first record of a first clock-tree segment at a first location in the IC and a second record of a second clock-tree segment at a second location in the IC and to be wired to the first clock-tree segment;
upon determining by the computer that a routing track is unavailable from a midpoint or approximate midpoint of the first clock-tree segment to the midpoint or approximate midpoint of the second clock-tree segment:
determine at least one of a first alternate location for the first clock-tree segment and a second alternate location for the second clock-tree segment such that a routing track is available to route a clock-signal wire from the midpoint or approximate midpoint of the first clock-tree segment to the midpoint or approximate midpoint of the second clock-tree segment;
update location information in at least one of the first record of the first clock-tree segment, from the first location to the first alternate location and the second record of the second clock-tree segment from the second location to the second alternate location;
generate a record of a first clock-tree segment hierarchically above the first and second clock-tree segments, wherein the first clock-tree segment hierarchically above the first and second clock-tree segments includes the first clock-tree segment wired to the second clock-tree segment by a first clock-signal wire in the routing track and connecting the midpoints or approximate midpoints of the first and second clock-tree segments; and
recursively update a record of at least one clock-tree segment hierarchically below the first and second clock-tree segments based upon updating the location information in at least one of the first and second records.

12. The system of claim 11, wherein each of the first clock-tree segment, the second clock-tree segment, the first clock-tree segment hierarchically above the first and second clock-tree segments, and the clock-tree segment hierarchically below the first and second clock-tree segments is a part of a symmetric or near symmetric clock-distribution, and wherein the computer is configured to:
select records of one or more clock-tree segments forming a sub-tree within the clock-distribution tree; and
upon determining that a new location is available for the sub-tree based upon the records of the one or more clock-tree segments and records of one or more routing tracks on the IC:
update location information in the records of each of the one or more clock-tree segments such that the sub-tree is moved to the new location.

13. The system of claim 11, wherein the computer is configured to:
upon determining by the computer that a routing track is available from the midpoint or approximate midpoint of the first clock-tree segment to the midpoint or approximate midpoint of the second clock-tree segment:
generate a record of a first clock-tree segment hierarchically above the first and second clock-tree segments, wherein the first clock-tree segment hierarchically above the first and second clock-tree segments includes the first clock-tree segment wired to the second clock-tree segment by a clock-signal wire in the routing track and connecting the midpoints or approximate midpoints of the first and second clock tree segments.

14. The system of claim 11, wherein each of the first clock-tree segment, the second clock-tree segment, the first clock-tree segment hierarchically above the first and second clock-tree segments, and the clock-tree segment hierarchically below the first and second clock-tree segments is a part of a symmetric or near symmetric clock-distribution H-tree among a plurality of symmetric or near symmetric independent clock-distribution H-trees, each occupying a different area of the IC.

15. The system of claim 14, wherein at least one clock-distribution H-tree among the plurality of clock-distribution H-trees is located at a higher metal layers in the IC, and wherein one or more clock-signal wires of the at least one clock-distribution H-tree have a relatively high metal pitch.

16. The system of claim 11, wherein the computer is configured to:

identify respective records of a first tapping-point and a second tapping-point;

determine that a first tapping-point should be wired to the second tapping-point based upon the location information in the respective records of the first and second tapping points; and generate the first record of the first clock tree segment that includes the first and second tapping points and a clock-signal wire interconnecting the first and second tapping points.

17. The system of claim 11, wherein the computer is configured to:

identify respective records of a third clock-tree segment and a fourth clock-tree segment, wherein the third and fourth clock-tree segments are hierarchically below the first and second clock-tree segments;

determine that the third clock-tree segment should be wired to the fourth clock-tree segment based upon the location information in the respective records of the third and fourth clock-tree segments; and generate the first record of the first clock-tree segment that includes the third and fourth clock-tree segments and a clock-signal wire interconnecting the third and fourth clock-tree segments.

18. The system of claim 11, wherein the computer is configured to:

identify a third record of a third clock-tree segment at a third location in the IC and a fourth record of a fourth clock-tree segment to be wired to the third clock-tree segment and at a fourth location in the IC, wherein the third and fourth clock-tree segments are hierarchically at same level as the first and second clock-tree segments;

generate a record of a second clock-tree segment hierarchically above the first, second, third, and fourth clock-tree segments, wherein the second clock-tree segment hierarchically above the first, second, third, and fourth clock-tree segment includes the third clock-tree segment wired to the fourth clock-tree segment by a second clock-signal wire interconnecting the midpoint or approximate midpoint of the third and fourth clock-tree segments; and upon determining by the computer that the wirelength of the second clock-signal wire is greater than the wirelength of the first clock-signal wire:

update the record of the first clock-tree segment hierarchically above the first and second clock-tree segments to indicate that the wirelength of the first clock-signal wire has been increased to equal or nearly equal the wirelength of the second clock-signal wire.

19. The system of claim 11, wherein to update the record of the at least one clock-tree segment hierarchically below the first and second clock-tree segments, computer is configured to:

update the location of the at least one clock-tree segment; and update wirelengths of one of more clock-signal wires in the at least one clock-tree segment.

20. The system of claim 11, wherein the routing track spans across at least two layers of the IC.

* * * * *